United States Patent [19]
Hatano et al.

[11] Patent Number: 6,165,908
[45] Date of Patent: Dec. 26, 2000

[54] SINGLE-LAYER-ELECTRODE TYPE CHARGE COUPLED DEVICE HAVING DOUBLE CONDUCTIVE LAYERS FOR CHARGE TRANSFER ELECTRODES

[75] Inventors: Keisuke Hatano; Yasutaka Nakashiba, both of Tokyo, Japan

[73] Assignee: NEC Corporation, Tokyo, Japan

[21] Appl. No.: 09/535,734

[22] Filed: Mar. 27, 2000

Related U.S. Application Data

[62] Division of application No. 09/033,855, Mar. 3, 1998, abandoned.

[30] Foreign Application Priority Data

Mar. 3, 1997 [JP] Japan ..................... 9-047646

[51] Int. Cl.[7] ................................. H01L 21/00
[52] U.S. Cl. .................... 438/719; 438/721; 438/723; 438/738
[58] Field of Search ..................... 438/719, 721, 438/723, 724, 733, 738, 743, 744

[56] References Cited

U.S. PATENT DOCUMENTS 5,296,653 3/1994 Kiyota et al. .
5,428,231 6/1995 Tanaka et al. .

FOREIGN PATENT DOCUMENTS

| 63-15460 | 1/1988 | Japan . |
| 3-19367 | 1/1991 | Japan . |
| 7-074337 | 3/1995 | Japan . |
| 7-211883 | 8/1995 | Japan . |

OTHER PUBLICATIONS

Kwok K. Ng, "Chapter 15—Charge–Coupled Device", Complete Guide to Semiconductor Devices, pp. 132–142.
N. Tanaka et al., "Study of single–layer metal–electrode CCD image sensor", Proceedings of the Institute of Television Engineers of Japan, vol. 50, No. 2, 1996, pp. 234–240.

*Primary Examiner*—William Powell
*Attorney, Agent, or Firm*—Young & Thompson

[57] ABSTRACT

In a charge coupled device, a plurality of charge transfer electrodes are formed on a first insulating layer formed on a semiconductor substrate. Each of the charge transfer electrodes is formed by a first conductive layer and a second conductive layer narrower than the first conductive layer. A second insulating layer having the same area as the second conductive layer and is formed on the second conductive layer. A sidewall insulating layer is formed on sidewalls of the second insulating layer and the second conductive layer.

6 Claims, 13 Drawing Sheets

POTENTIAL

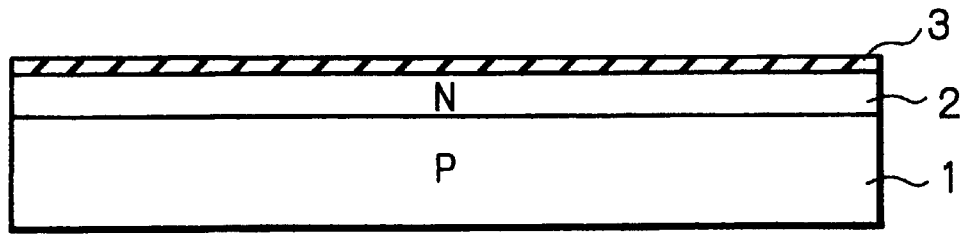
Fig. 5A
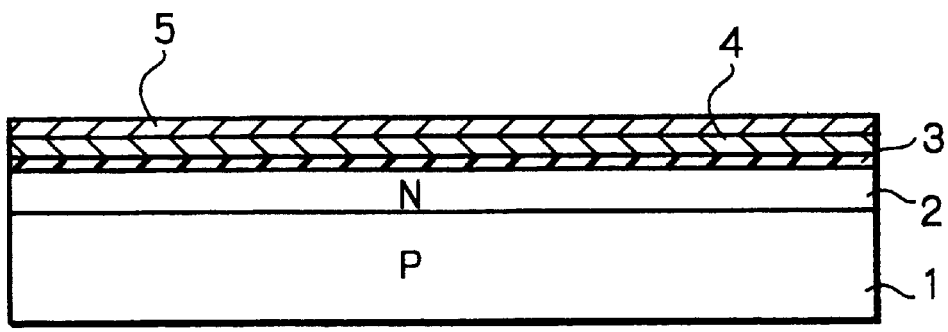
Fig. 5B
Fig. 5C
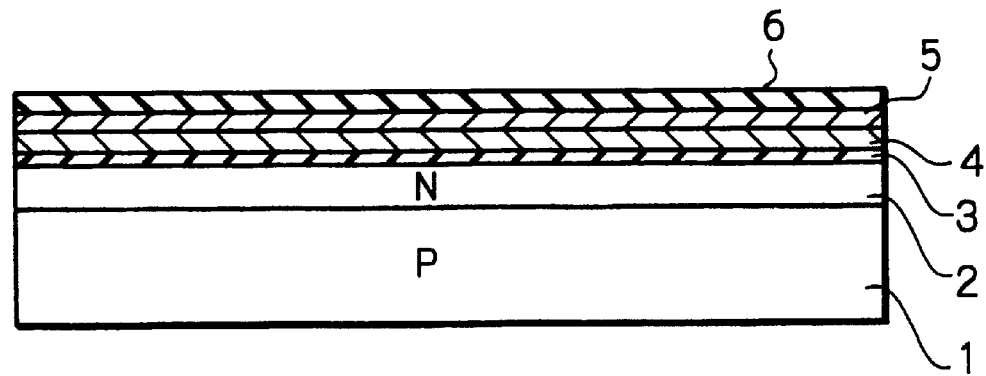

POTENTIAL

SINGLE-LAYER-ELECTRODE TYPE CHARGE COUPLED DEVICE HAVING DOUBLE CONDUCTIVE LAYERS FOR CHARGE TRANSFER ELECTRODES

CROSS-REFERENCE TO RELATED APPLICATIONS

This application is a division of application Ser. No. 09/033,855, filed Mar. 3, 1998, now abandoned.

BACKGROUND OF THE INVENTION

1. Field of the Invention

The present invention relates to a single-layer-electrode type charge coupled device (CCD) and a method for manufacturing the same.

2. Description of the Related Art

Recently, single-layer-electrode type CCDs have been developed by etching a single conductive layer with a fine photolithography and etching process to obtain electrodes whose spacing is about 0.2 to 0.3 $\mu$m.

In the single-layer-electrode CCDs, since no overlapping of the electrodes is present, a capacitance between the electrodes can be small and no poor insulation is present between the electrodes. Further, since it is unnecessary to oxidize the electrodes to obtain insulation thereof, the electrodes can be made of metal or silicide in addition to polycrystalline silicon, to further reduce the resistances of the electrodes.

In a prior art method for manufacturing a CCD, a plurality of charge transfer electrodes are formed on a first insulating layer formed on a semiconductor substrate. Double conductive layers are formed on the first insulating layer. A second insulating layer is formed on the double conductive layers, and the second insulating layer is patterned by a photolithography and etching process. In addition, a sidewall insulating layer is formed on a sidewall of the patterned second insulating layer. The double conductive layers are etched by using the sidewall insulating layer as well as the second insulating layer as a mask, thus forming charge transfer electrodes (see: N. Tanaka et al., "Study of Single-Layer Metal-Electrode CCD Image Sensor", Proceedings of the Institute of Television Engineers of Japan, Vol. 50, No. 2, pp. 234–240, 1996). This will be explained later in detail.

In the prior art method, the spacing between the charge transfer electrodes, is decreased by providing the sidewall insulating layer on the sidewall of the second insulating layer.

In the prior art method, however, in order to reduce the spacing between the charge transfer electrodes it is impossible to increase the width of the sidewall insulating layer. In other words, the width of the sidewall insulating layer is generally dependent upon only the thickness of the second insulating layer.

On the other hand, when the thickness of the second insulating layer is increased, the step coverage characteristics of the overlying insulating layer are deteriorated, so that metal wiring layers are disconnected and the insulation breakdown characteristics between the charge transfer electrodes and the metal wiring layers are deteriorated.

SUMMARY OF THE INVENTION

It is an object of the present invention to provide a single-layer-electrode type CCD capable of decreasing the spacing between charge transfer electrodes.

Another object is to provide a method for manufacturing the above-mentioned CCD.

According to the present invention, in a charge coupled device, a plurality of charge transfer electrodes are formed on a first insulating layer formed on a semiconductor substrate. Each of the charge transfer electrodes is formed by a first conductive layer and a second conductive layer narrower than the first conductive layer. A second insulating layer having the same area of the second conductive layer and is formed on the second conductive layer. A sidewall insulating layer is formed on sidewalls of the second insulating layer and the second conductive layer. Thus, the width of the sidewall insulating layer is dependent upon the thickness of the second insulating layer and the thickness of the second conductive layer.

Also, in a method for manufacturing CCD, a plurality of charge transfer electrodes are formed on a first insulating layer formed on a semiconductor substrate. Double conductive layers are formed on the first insulating layer. A second insulating layer is formed on the double conductive layers, and the second insulating layer and the upper layer of the double conductive layers are patterned by the same mask. In addition, a sidewall insulating layer is formed on a sidewall of the patterned second insulating layer and the upper layer of the double conductive layers. The lower layer of the double conductive layers is etched by using the sidewall insulating layer as well as the second insulating layer as a mask, thus forming charge transfer electrodes.

BRIEF DESCRIPTION OF THE DRAWINGS

The present invention will be more clearly understood from the description as set forth below, with reference to the accompanying drawings, wherein:

FIGS. 5A through 5J are cross-sectional views for explaining an embodiment of the method for manufacturing a single-layer-electrode type two-phase CCD according to the present invention;

DESCRIPTION OF THE PREFERRED EMBODIMENT

Before the description of the preferred embodiment, a method for manufacturing a single-layer-electrode type two-phase CCD will be explained with reference to FIGS. 1A through 1J (see: N. Tanaka et al., "Study of Single-Layer Metal-Electrode CCD Image Sensor", Proceedings of the Institute of Television Engineers of Japan, Vol. 50, No. 2, pp. 234–240, 1996). Note that the CCD of FIGS. 1A through 1J is of a burled channel type.

Figure 1A:
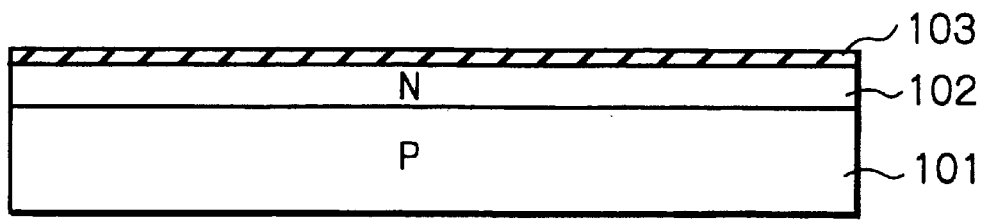
FIGS. 1A and 1J are cross-sectional views for explaining a prior art method for manufacturing a single-layer-electrode type two-phase CCD.

First, referring to FIG. 1A, an N-type semiconductor layer 102 is formed on a P-type semiconductor substrate 101 formed by monocrystalline silicon. Then, the semiconductor substrate 101 (the N-type semiconductor layer 102) is thermally oxidized to form a silicon oxide layer. Also, a silicon layer and a silicon oxide layer are deposited thereon to an insulating layer 103 of a triple-strudure.

Figure 1B:
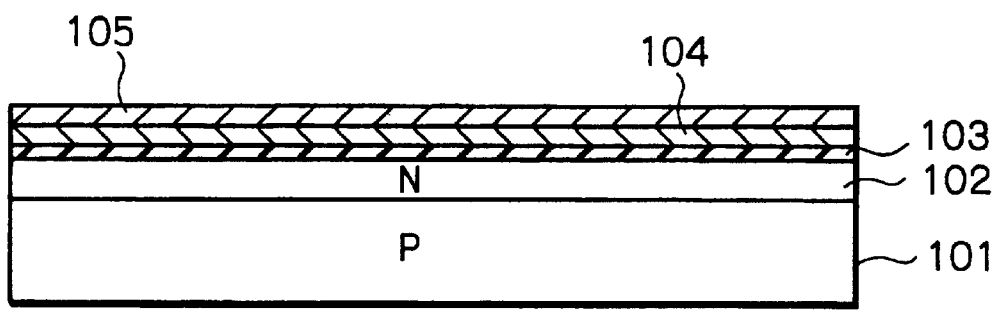

Next, referring to FIG. 1B, an about 0.1 μm thick polycrystalline silicon layer 104 and an about 0.1 μm thick tungsten silicide layer 105 are deposited on the entire surface.

Figure 1C:
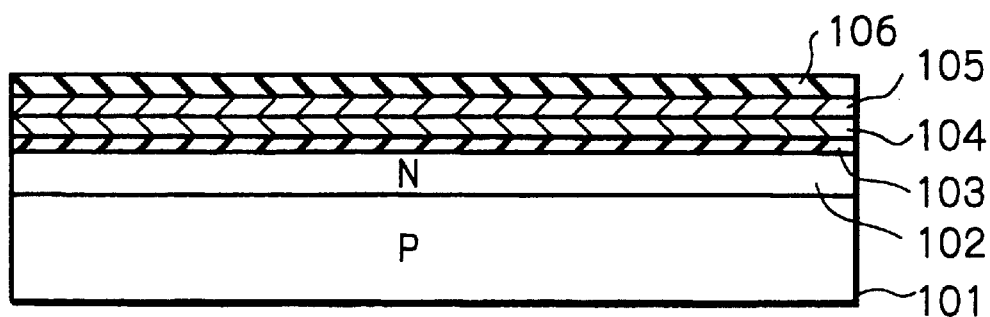

Next, referring to FIG. 1C, an about 0.2 μm thick silicon oxide layer 106 is deposited on the entire surface by a chemical vapor deposition (CVD) process.

Figure 1D:
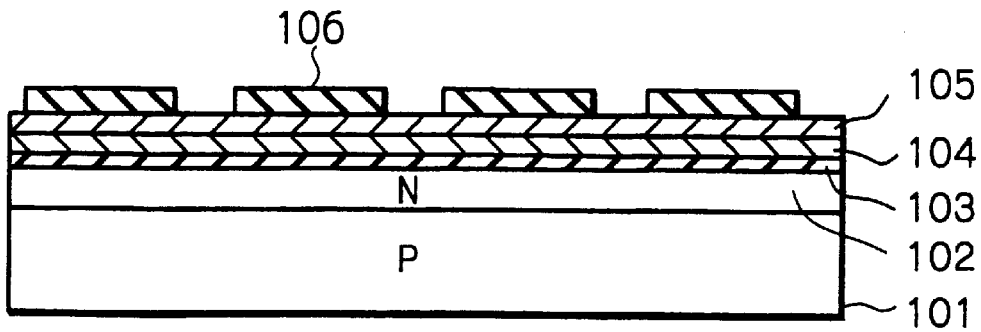

Next, referring to FIG. 1D, the silicon oxide layer 106 is patterned by a photolithography and etching process.

Figure 1E:
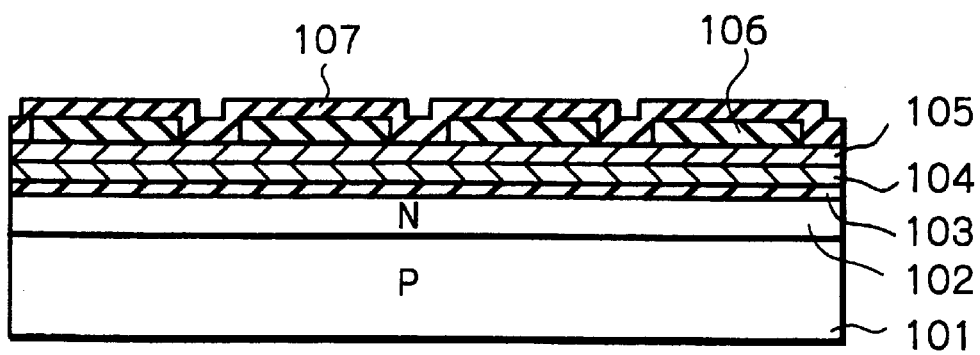

Next, referring to FIG. 1E, an about 0.2 μm thick silicon oxide layer 107 is deposited on the entire surface by a CVD process.

Figure 1F:
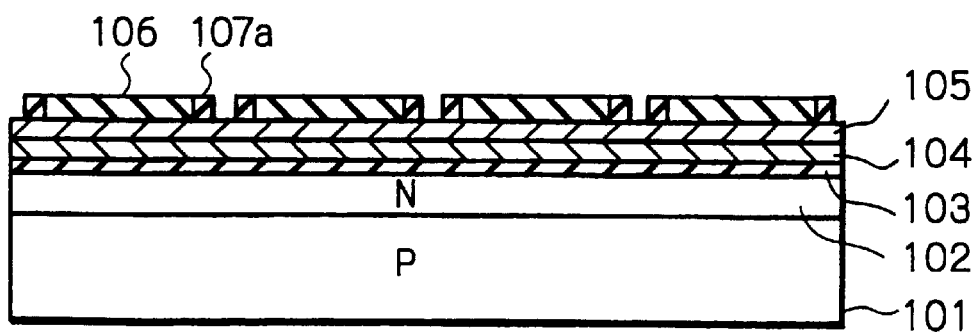

Next, referring to FIG. 1F, the silicon oxide layer 107 is etched back by an anisotropic etching process. As a result, the silicon oxide layer 107 is left as a sidewall silicon oxide layer 107a on a sidewall of the silicon oxide layer 106.

Figure 1G:
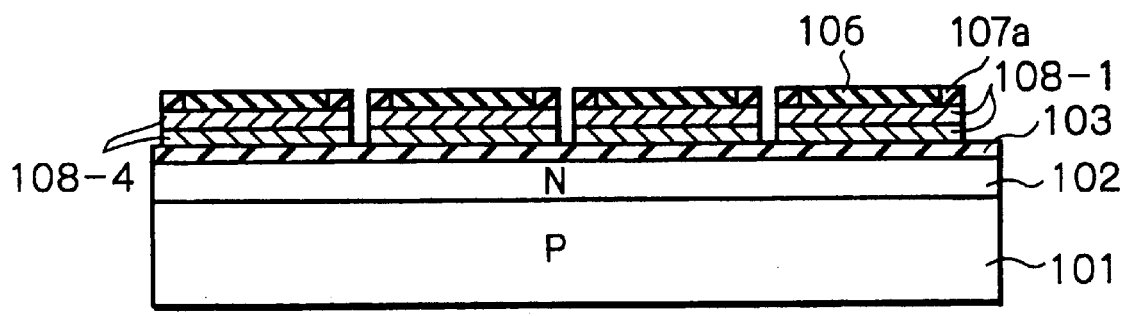

Next, referring to FIG. 1G, the tungsten silicide layer 105 and the polycrystalline silicon layer 104 are patterned by an etching process using the silicon oxide layer 106 and the sidewall silicon oxide layer 107a as a mask to form charge transfer electrodes 108-1, ..., 108-4 whose spacing is about 0.2 μm.

Figure 1H:
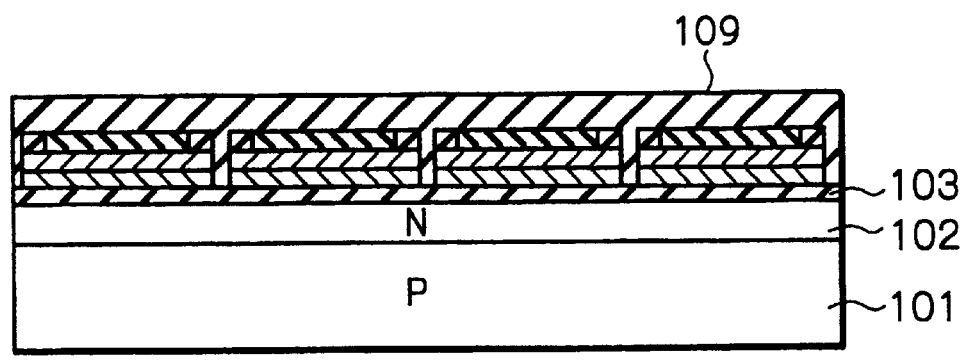

Next, referring to FIG. 1H, an insulating layer 109 is deposited on the entire surface by a CVD process.

Figure 1I:
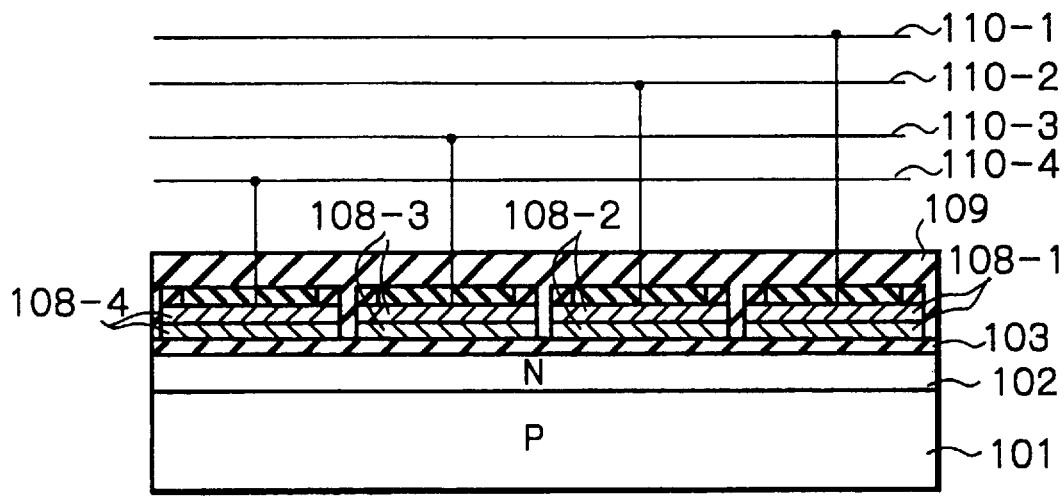

Next, referring to FIG. 1I, metal wiring layers 110-1, 110-2, 110-3 and 110-4 are formed and connected to the charge transfer electrodes 108-1, 108-2, 108-3 and 108-4, respectively.

Figure 1J:
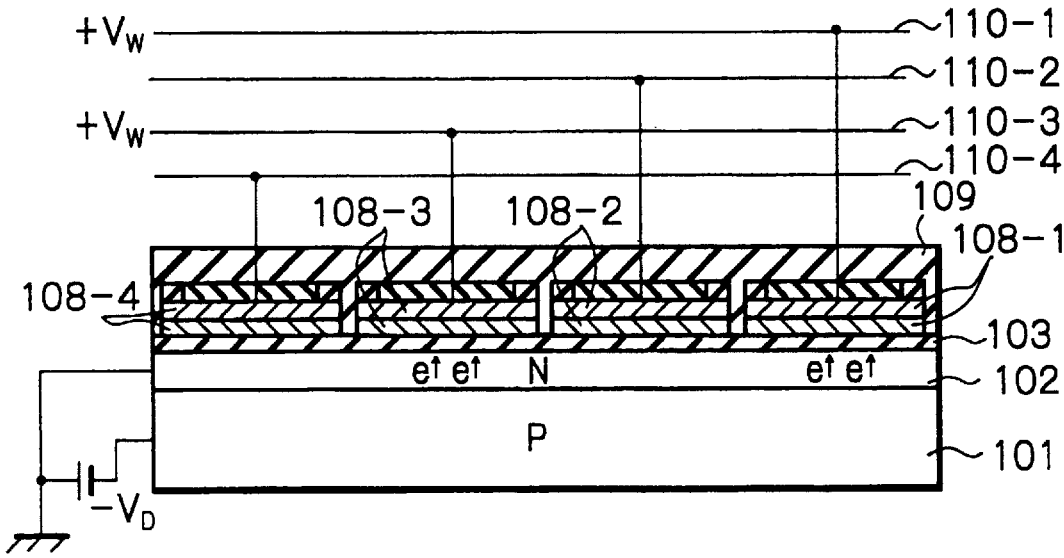

Finally, referring to FIG. 1J, a reverse bias voltage $V_D$ is applied between the semiconductor substrate 101 and the N-type semiconductor layer 102, so that the N-type semiconductor layer 102 becomes in an electron accumulation state. In this state, a positive pulse voltage+$V_w$ such as +40V is applied to the metal wiring layers 101-1 and 101-3. As a result, electrons are injected from the N-type semiconductor layer 102 into the insulating layer layer 103 under the charge transfer electrodes 108-1 and 108-3 by the tunneling effect. Therefore, electrons are trapped in the triple-structured insulating layer 103 urder the charge transfer electrodes 108-1 and 108-3.

Figure 2A:
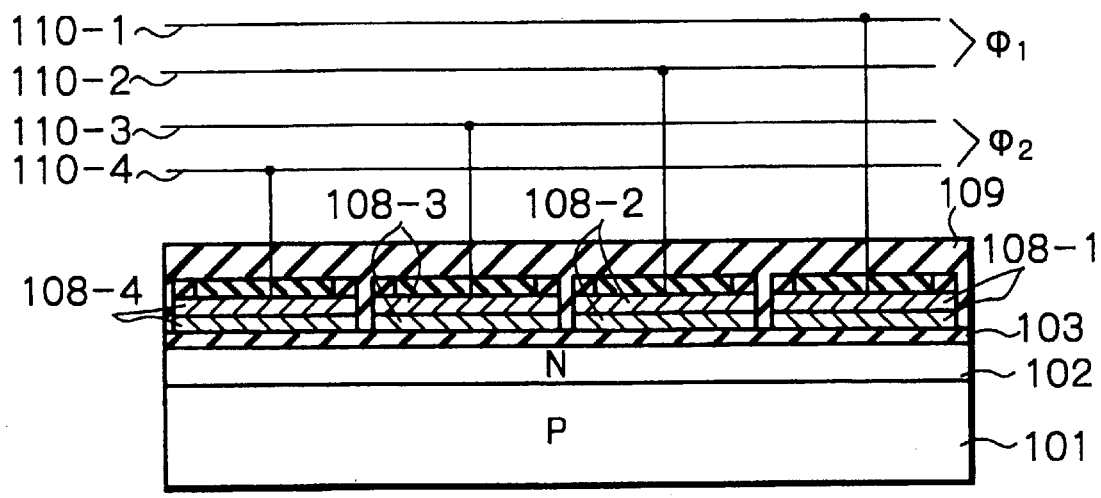
FIG. 2A is a cross-sectional view showing the operation of the CCD of FIG. 1J.
Figure 2B:
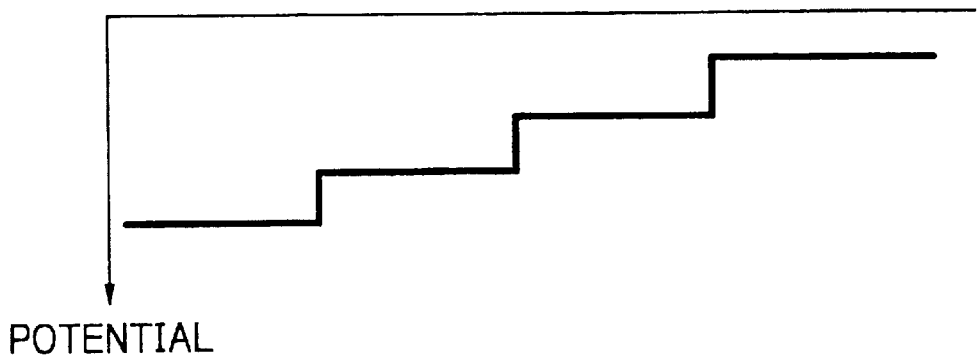
FIG. 2B is a potential diagram of the CCD of FIG. 2A.

Thus, in the prior art CCD, the electron-injected portions of the insulating layer 103 serving as potential barrier regions are in self-alignment with the charge transfer electrodes 108-1 and 108-3. Therefore, when clock signals $ø_1$ and $ø_2$ opposite in phase to each other are applied to the metal wiring layers 110-1 (110-2) and 110-3 (110-4), respectively, as shown in FIG. 2A, the potential within the device is as shown in FIG. 2B.

In the prior art CCD of FIGS. 1A through 1J, 2A and 2B, the spacing between the charge transfer electrodes 108-1, 108-2, ... is decreased by providing the sidewall silicon oxide layer 107a on the sidewall of the silicon oxide layer 106.

Figure 3:
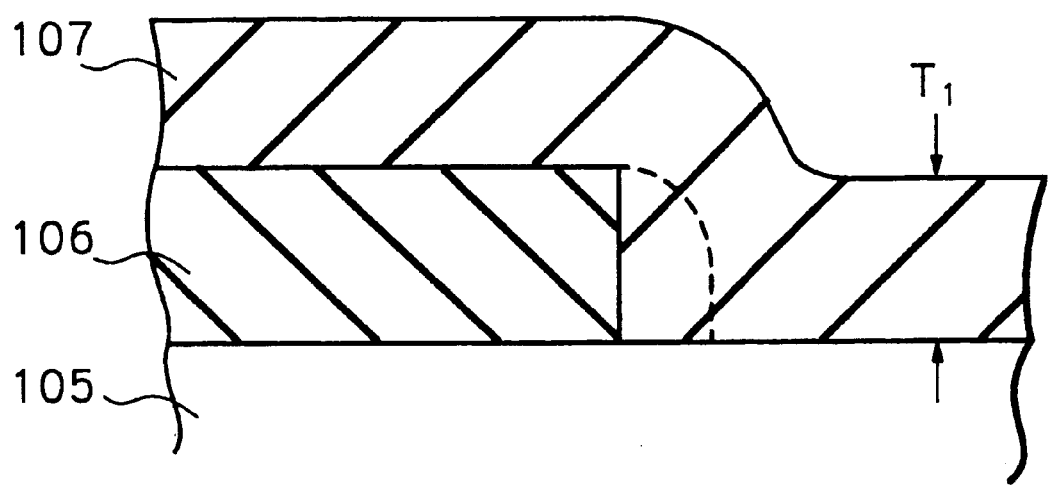
FIGS. 3 and 4 are cross-sectional views for explaining the problems in the prior art method of FIGS. 1A and 1J.
Figure 3:
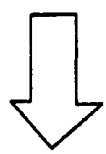
Figure 3:
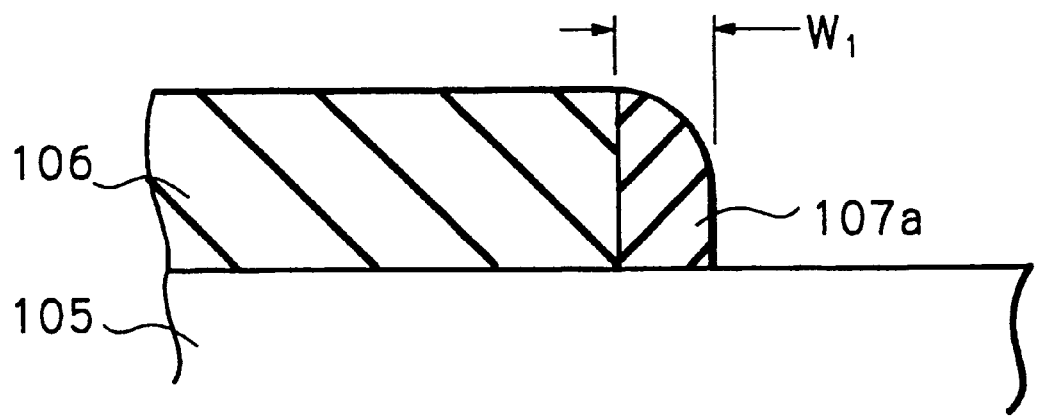
Figure 4:
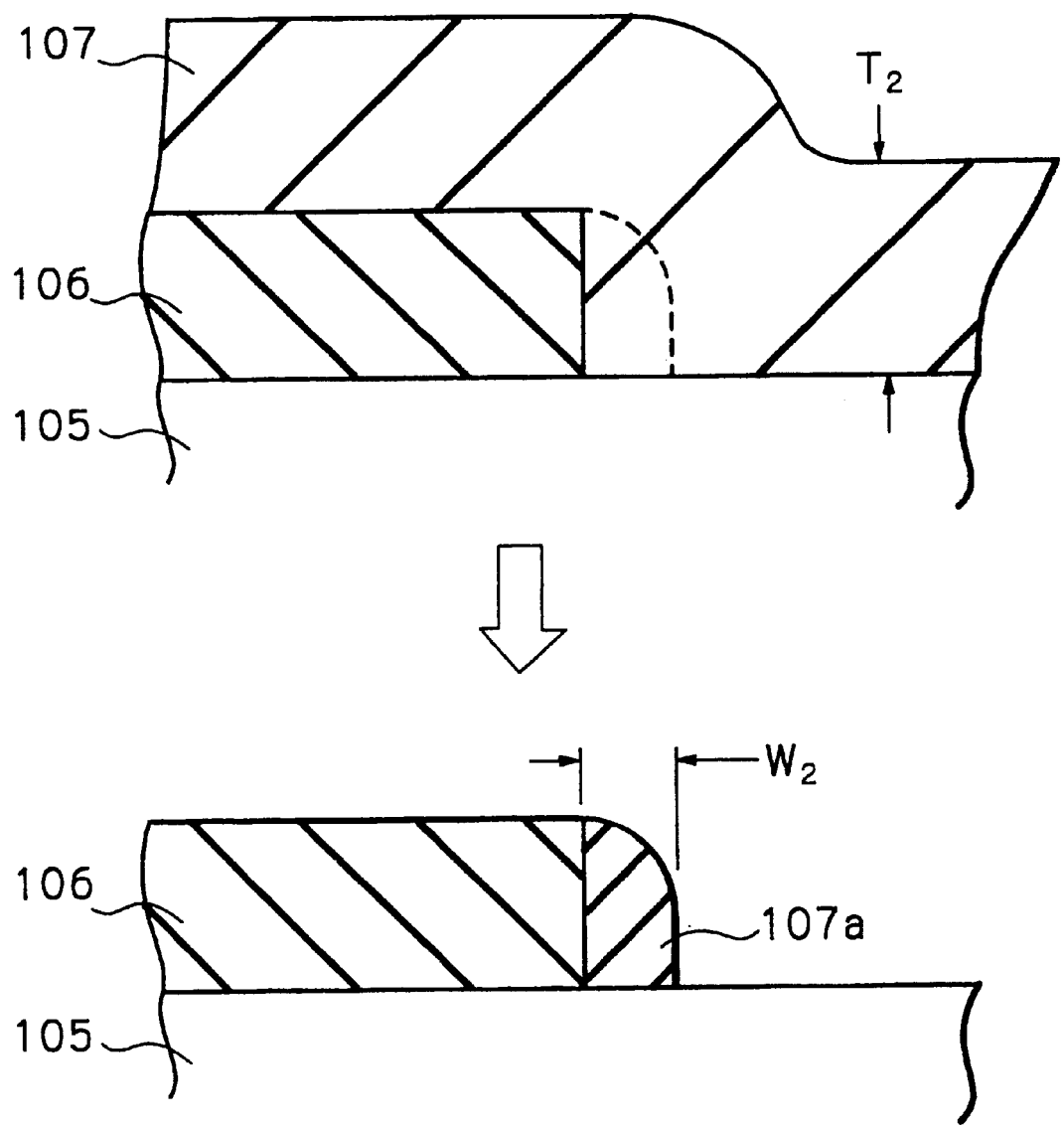

In the prior art CCD of FIGS. 1A through 1J, 2A and 2B, however, in order to reduce the spacing between the charge transfer electrodes 108-1, 108-2, ..., even when the thickness T of the silicon oxide layer 107 is increased, it is impossible to increase the width W of the sidewall silicon oxide layer 107a. For example, as shown in FIG. 3, if the thickness of the silicon oxide layer 107 is $T_1$, the width of the sidewall silicon oxide layer 107a is $W_1$. On the other hand, as shown in FIG. 4, if the thickness of the silicon oxide layer 107 is $T_2$ ($>T_1$), the width of the sidewall silicon oxide layer 107a $W_2$. In this case, if $T_1>T_0$ (critical value), $$W_1 \leftrightarrows W_2.$$

Note that the width of the sidewall silicon oxide layer 107a is generally dependent upon only the thickness of the silicon oxide layer 106. That is, the larger the thickness of the silicon oxide layer 106, the larger the width of the sidewall silicon oxide layer 107a.

On the other hand, when the thickness of the silicon oxide layer 106 is increased, the step coverage characteristics of the insulating layer 109 are deteriorated, so that the metal wiring layers 110-1, 110-2, 110-3 and 110-4 are disconnected and the insulation breakdown characteristics between the charge transfer electrodes 108-1, 108-2, 108-3 and 108-4 and the metal wiring layers 110-1, 110-2, 110-3 and 110-4 are deteriorated.

An embodiment of the method for manufacturing a CCD according to the present invention will be explained with reference to FIGS. 5A through 5J. Not that the CCD of FIGS. 5A through 5J is of a buried channel type.

First, referring to FIG. 5A, in the same way as in FIG. 1A, an N-type semiconductor layer 2 is formed on a P-type semiconductor substrate 1 formed by monocrystalline silicon. Then, the semiconductor substrate 1 (the N-type semiconductor layer 2) is thermally oxidized to form an about 200 Å thick silicon oxide layer. Also, an about 200 Å thick silicon nitride layer and an about 500 Å thick silicon oxide layer are deposited by a CVD process. In this case, a triple-structured insulating layer 3 mad of silicon oxide/silicon nitride/silicon oxide (ONO) is formed.

Next, referring to FIG. 5B, in the same way as in FIG. 1B, an about 0.1 μm thick polycrystalline silicon layer 4 and an about 0.1 μm thick tungsten silicide layer 5 are deposited on the entire surface.

Next, referring to FIG. 5C, in the same way as in FIG. 1C, an about 0.2 μm thick silicon oxide layer 6 is deposited on the entire surface by a CVD process.

Figure 5D:
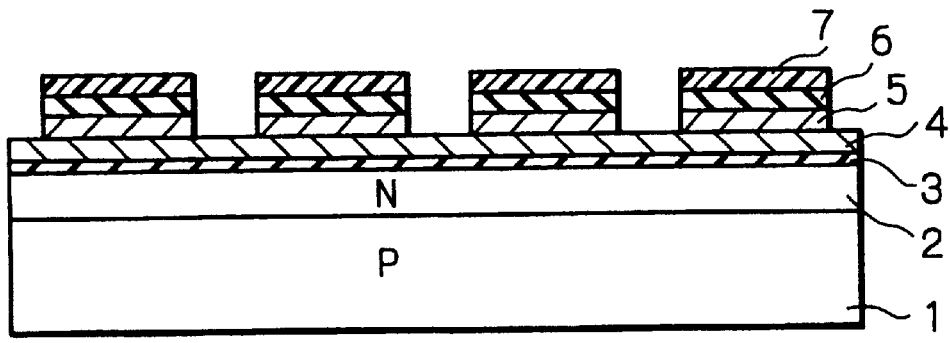

Next, referring to FIG. 5D, a photoresist pattern 7 is formed by a photolithography process. Then, the silicon oxide layer 6 and the tungsten silicide layer 5 are simultaneously etched by using the photoresist pattern 7 as a mask. Then, the photoresist pattern 7 is removed.

Figure 5E:
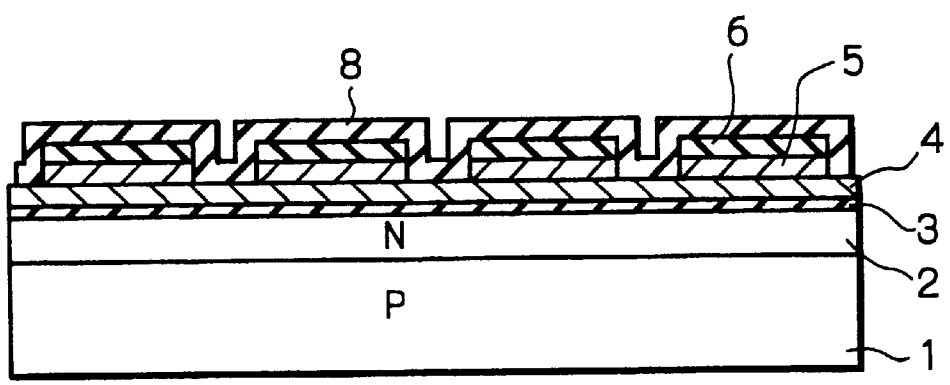

Next, referring to FIG. 5E, in the same way as in FIG. 1E, an about 0.2 μm thick silicon oxide layer 7 is deposited on the entire surface by a CVD process.

Figure 5F:
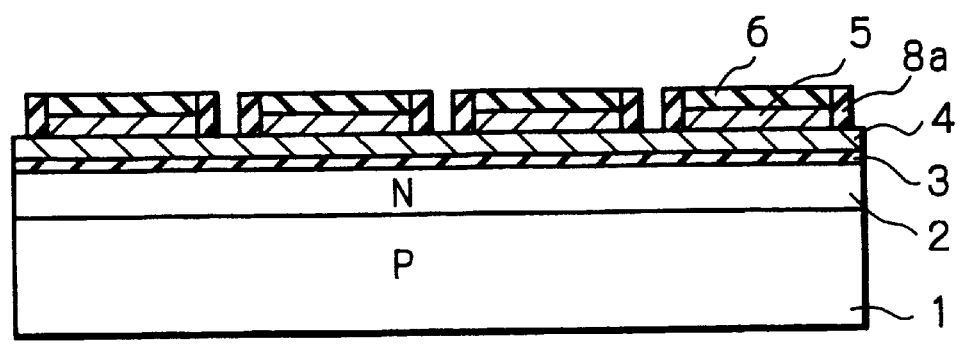

Next, referring to FIG. 5F, in the same way as in FIG. 1F, the silicon oxide layer 8 is etched back by an anisotropic etching process. As a result, the silicon oxide layer 8 is left as a sidewall silicon oxide layer 8a on a sidewall of the silicon oxide layer 106 and a sidewall of the tungsten silicide layer 5.

Figure 5G:
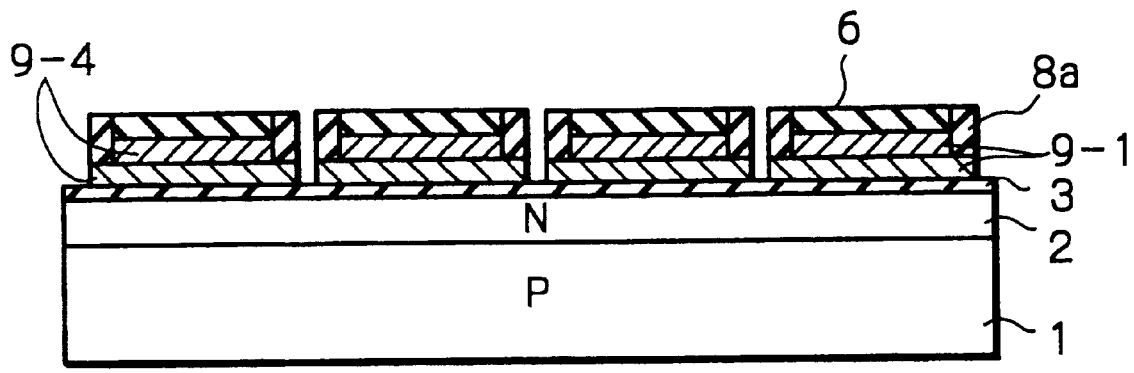

Next, referring to FIG. 5G, the polycrystalline silicon layer 4 is etched by an etching process using the silicon oxide layer 6 and the sidewall silicon oxide layer 8a as a mask to form charge transfer electrodes 9-1, ..., 9-4 whose spacing is about 0.2 μm.

Figure 5H:
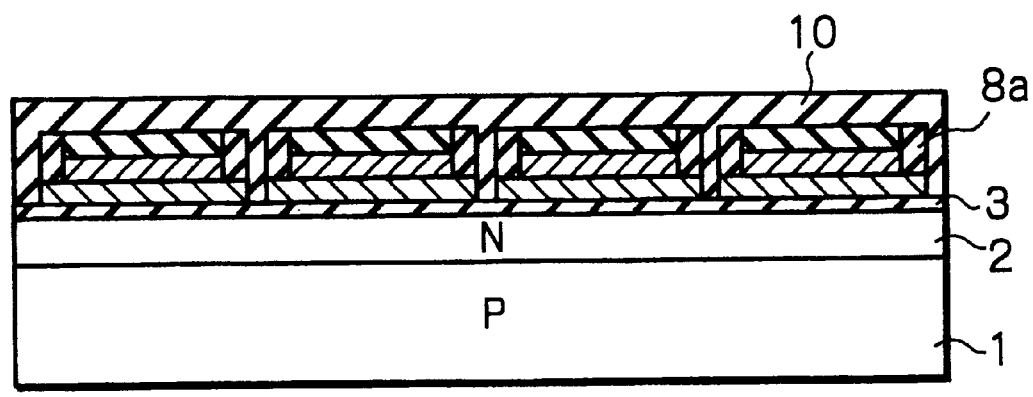

Next, referring to FIG. 5H, in the same way as in FIG. 1H, an insulating layer 10 is deposited on the entire surface by a CVD process.

Figure 5I:
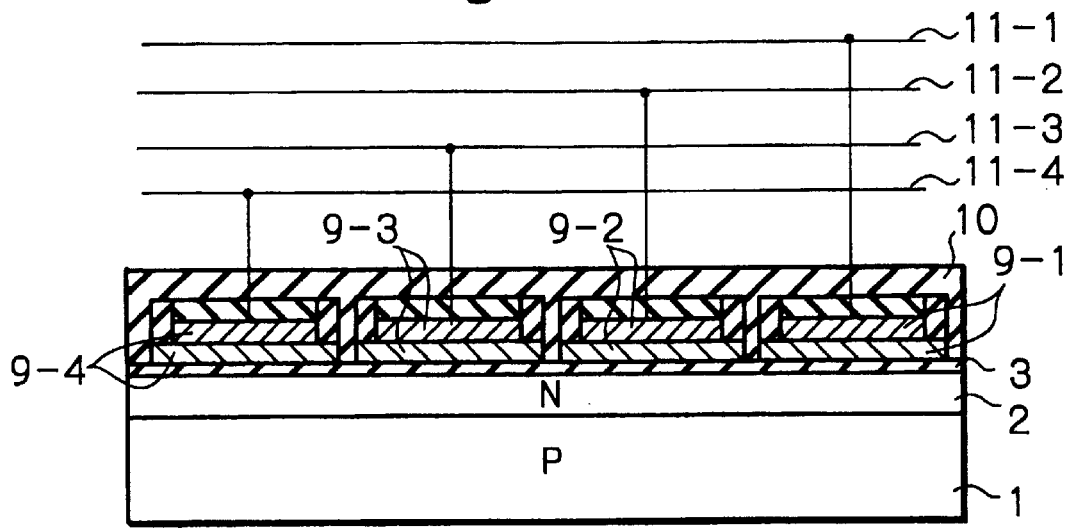

Next, referring to FIG. 5I, in the same way as in FIG. 1I, metal wiring layers 11-1, 11-2, 11-3 and 11-5 are formed and connected to the charge transfer electrodes 9-1, 9-2, 9-3 and 9-4, respectively.

Figure 5J:
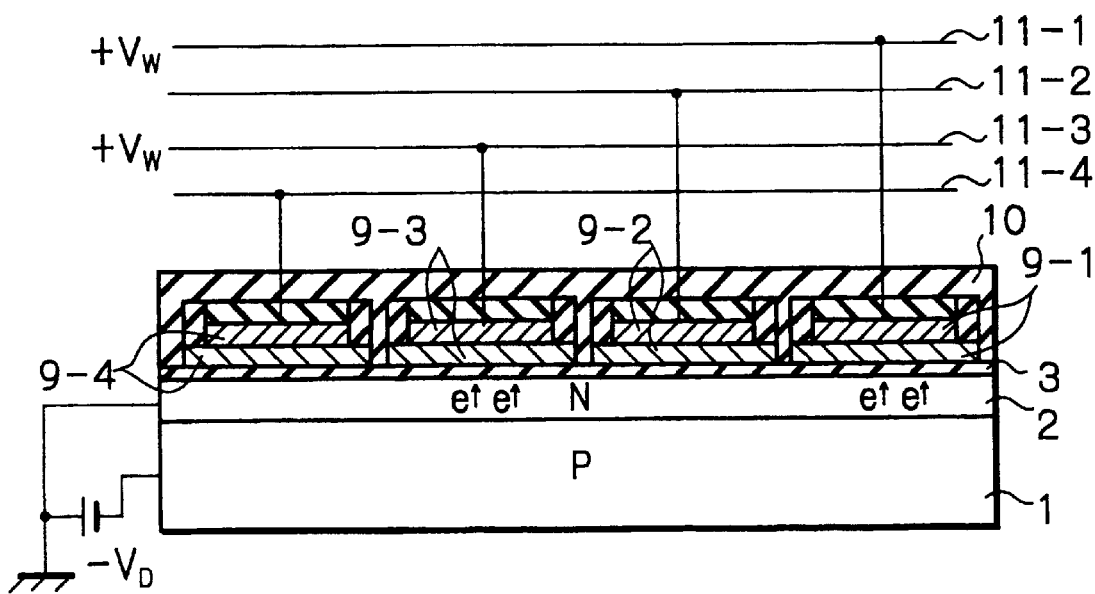

Finally, referring to FIG. 5J, in the same way as in FIG. 1J, a reverse bias voltage $V_D$ is applied between the semiconductor substrate 1 and the N-type semiconductor layer 2, so that the N-type semiconductor layer 2 becomes in an electron accumulation state. In this state, a positive pulse voltage+$V_W$ such as +40V is applied to the metal wiring layers 11-1 and 11-3. As a result, electrons are injected from the N-type semiconductor layer 2 into the insulating layer 3 under the charge transfer electrodes 9-1 and 9-3 by the tunneling effect. Therefore, electrons are trapped in the insulating layer 3 under the charge transfer electrodes 9-1 and 9-3, particularly at the interface between the triple structure insulating layer under the charge transfer electrode 9-1 and 9-3.

Figure 6A:
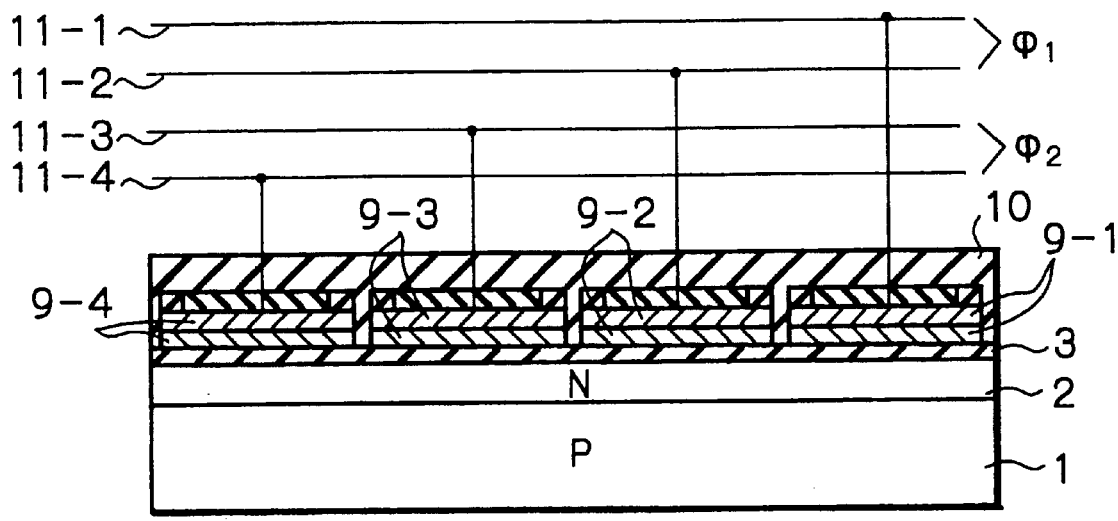
FIG. 6A is a cross-sectional view showing the operation of the CCD of FIG. 5J.
Figure 6B:
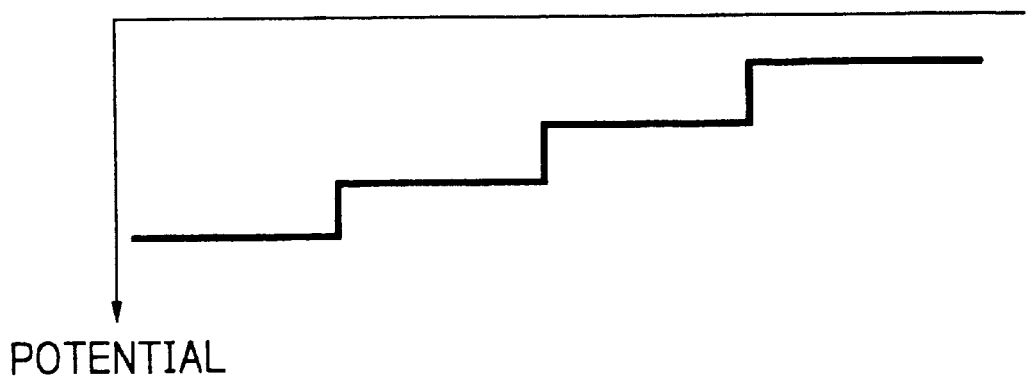
FIG. 6B is a potential diagram of the CCD of FIG. 6A.

Thus, even in the embodiment, the electron-injected portions of the insulating layer 3 serving as potential barrier regions are in self-alignment with the charge transfer electrodes 9-1 and 9-3. Therefore, when clock signals $\phi_1$ and $\phi_2$ opposite in phase to each other are applied to the metal wiring layers 11-1 (11-2) and 11-3 (11-4), respectively, as shown in FIG. 6A, the potential within the device is as shown in FIG. 6B.

In the CCD of FIGS. 5A through 5J, 6A and 6B, the spacing between the charge transfer electrodes 9-1, 9-2, . . . is decreased by providing the sidewall silicon oxide layer 8a on the sidewall of the tungsten silicide layer 5 and the silicon oxide layer 6. Therefore, the width of the sidewall silicon oxide layer 8a is dependent upon a sum of the thickness of the tungsten silicide layer 5 and the thickness of the silicon oxide layer 6. As a result, even if the thickness of the silicon oxide layer 6 is the same as that of the silicon oxide layer 106 of the prior art CCD, the width of the sidewall silicon oxide layer 8a is remarkably larger than that of the sidewall silicon oxide layer 107a of the prior art CCD, so that the spacing between the charge transfer electrodes 9-1, 9-2, 9-3 and 9-4 can be decreased.

Also, since it is unnecessary to increase the thickness of the silicon oxide layer 6, the step coverage characteristics of the insulating layer 10 are not deteriorated, so that the disconnection of the metal wiring layers 11-1, 11-2, 11-3 and 11-4 can be avoided and the insulation breakdown characteristics between the charge transfer electrodes 9-1, 9-2, 9-3 and 9-4 and the metal wiring layers 11-1, 11-2, 11-3 and 11-4 are not deteriorated.

In addition, since the parasitic capacitance between the charge transfer electrodes 9-1, 9-2, 9-3 and 9-4 is substantially dependent only upon the area of the sidewall of the polycrystalline silicon layer 4, such parasitic capacitance can be decreased. In the prior art CCD of FIGS. 1A through 1J, note that the parasitic capacitance between the charge transfer electrodes 108-1, 108-2, 108-3 and 108-4 is substantially dependent only upon the area of the sidewall of the polycrystalline silicon layer 104 and the sidewall of the tungsten silicide layer 105.

Moreover, since the tungsten silicide layer 5 is etched by using the polycrystalline silicon layer 4 as an etching stopper as illustrated in FIG. 5D, the accuracy of the etched tungsten silicide layer 5 becomes high, so that the fluctuation of the spacing between the charge transfer electrodes 9-1, 9-2, 9-3 and 9-4 can be suppressed.

In FIG. 5J, although a positive pulse voltage+$V_W$ is applied to the metal wiring layers 11-1 and 11-3, it is possible to apply a negative pulse voltage−$V_W$ such as −40v to the metal wiring layers 11-1 and 11-3. In this case, electrons are injected from charge transfer electrodes 9-1 and 9-3 into the silicon oxide layer 3 under the charge transfer electrodes 9-1 and 9-3. Therefore, electrons are trapped in the silicon oxide layer 3 under the charge transfer electrodes 9-1 and 9-3, particularly, at the interface of the triple-structured insulating layer.

In the above-mentioned embodiment, a refractory metal silicide layer made of molybdenum silicide or titanium silicide or a refractory metal layer made of tungsten, molybdenum or titanium can be used instead of the tungsten silicide layer 5.

Also, the present invention can be applied to a buried channel type P-channel CCD where the semiconductor substrate 1 is of an N-type and the semiconductor layer 2 is of a P-type.

Figure 7:
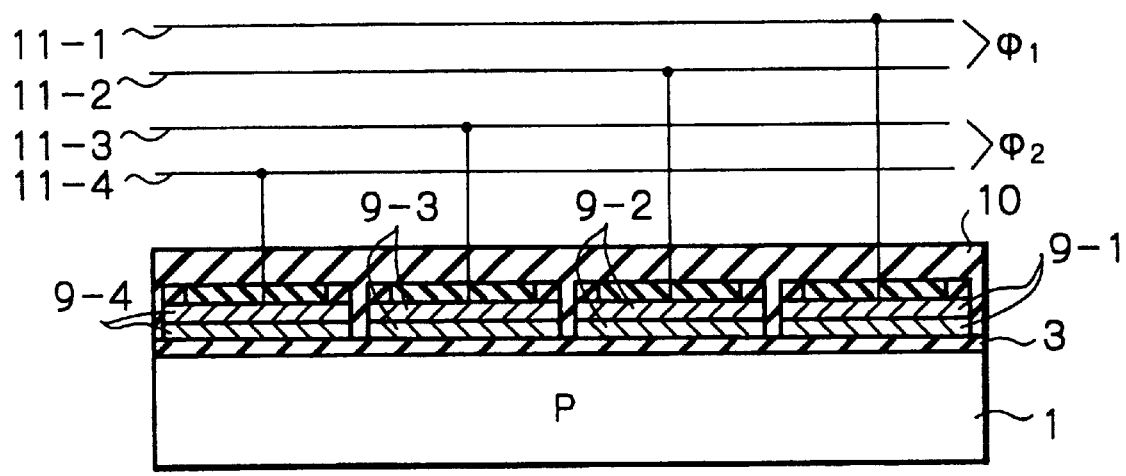
FIG. 7 is a cross-sectional view illustrating a modification of the CCD of FIG. 6A.

Further, the present invention can be applied to a surface channel type CCD where the conductivity type of the semiconductor substrate 1 is the same as that of the semiconductor layer 2, or the semiconductor layer 2 is omitted so that the insulating layer 3 is formed directly on the semiconductor substrate 1 as illustrated in FIG. 7.

Moreover, the present invention can be applied to a single-layer-electrode type four-phase CCD. In this case, the triple-structured insulating layer 3 is replaced by a single insulating layer made of silicon oxide.

In addition, in FIG. 5J, holes can be injected. In this case, the hole injected portions below the charge transfer electrodes serve as charge accumulation regions, not as potential barrier regions.

Still further, the CCD can be formed in a semiconductor well within a semiconductor substrate.

As explained hereinabove, according to the present invention, since the width of the sidewall insulating layer for decreasing the spacing between the charge transfer electrodes is increased, the spacing between the charge transfer electrodes can be remarkably decreased.

What is claimed is:

1. A method for manufacturing a charge coupled device comprising the steps of:

forming a first insulating layer on a semiconductor substrate of a first conductivity type;

forming a first conductive layer on said first insulating layer;

forming a second conductive layer on said first conductive layer;

forming a second insulating layer on said second conductive layer;

patterning said second insulating layer and said second conductive layer using a photoresist pattern;

forming a third insulating layer on said second insulating layer, said second conductive layer and said first conductive layer, after said second insulating layer and said second conductive layer are patterned;

etched back said third insulating layer, so that a sidewall insulating layer is left on sidewalls of said second insulating layer and said second conductive layer;

etching said first conductive layer using said second insulating layer and said sidewall insulating layer;

forming a fourth insulating layer on said first conductive layer, said sidewall insulating layer and said second insulating layer, after said first conductive layer is etched;

forming metal wiring layers on said fourth insulating layer, said metal wiring layers being connected to said second conductive layers.

2. The method as set forth in claim 1, wherein said first insulating layer is made of silicon oxide.

3. The method as set forth in claim 1, wherein said first insulating layer comprises a triple-structured insulating layer made of silicon oxide, silicon nitride and silicon oxide.

4. The method as set forth in claim 1, wherein said first conductive layer is made of polycrystalline silicon.

5. The method as set forth in claim 1, wherein said second conductive layer is made of one of refractory metal silicide and refractory metal.

6. The method as set forth in claim 1, further comprising a step of forming a semiconductor layer of a second conductivity type on said semiconductor substrate before said first insulating layer is formed.

* * * * *